(12) United States Patent
Yoshinaga et al.

(10) Patent No.: US 9,852,022 B2
(45) Date of Patent: Dec. 26, 2017

(54) MEMORY SYSTEM, MEMORY CONTROLLER AND MEMORY CONTROL METHOD

(71) Applicant: Toshiba Memory Corporation, Minato-ku (JP)

(72) Inventors: Yuma Yoshinaga, Yokohama (JP); Ryo Yamaki, Yokohama (JP); Daiki Watanabe, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/015,621

(22) Filed: Feb. 4, 2016

(65) Prior Publication Data

US 2017/0068593 A1    Mar. 9, 2017

Related U.S. Application Data

(60) Provisional application No. 62/214,518, filed on Sep. 4, 2015.

(51) Int. Cl.
*G06F 11/10* (2006.01)
*G11C 29/52* (2006.01)
(Continued)

(52) U.S. Cl.
CPC ...... *G06F 11/1068* (2013.01); *G11C 11/5642* (2013.01); *G11C 29/36* (2013.01);
(Continued)

(58) Field of Classification Search
CPC .................................................. G06F 11/1076
(Continued)

(56) References Cited

U.S. PATENT DOCUMENTS 3,539,408 A * 11/1970 Cashau ............... C23F 1/26
                                                            205/657
5,588,112 A * 12/1996 Dearth ............... G06F 11/106
                                                            710/22

(Continued)

FOREIGN PATENT DOCUMENTS

| JP | 2003-46395 | 2/2003 |
| JP | 2014-155052 | 8/2014 |

OTHER PUBLICATIONS

David Chase, "A Class of Algorithms for Decoding Block Codes With Channel Measurement Information", IEEE Transactions on Information Theory, vol. IT-18, (1), 1972, 13 pgs.

*Primary Examiner* — Fritz Alphonse
(74) *Attorney, Agent, or Firm* — Oblon, McClelland, Maier & Neustadt, L.L.P.

(57) ABSTRACT

According to the embodiments, a memory system includes a non-volatile memory, a control unit that reads a received word from the non-volatile memory, and a decoder that performs soft-decision decode to the received word. The decoder includes a test pattern generating unit that generates test patterns, a hard decision decoder that performs hard-decision decode by using the test pattern and the received word and outputs a decoded word, and a distance calculating unit that calculates Euclidean distance between the decoded word and the received word based on the decoded words of which the number is less than that of the test patterns of all the combinations in a case where the number of flips is of one to a predetermined value and selects a decoded word which is the decoding result from among the decoded words output from the hard decision decoder based on the Euclidean distance.

17 Claims, 11 Drawing Sheets

(51) Int. Cl.
*H03M 13/45* (2006.01)
*G11C 11/56* (2006.01)
*G11C 29/36* (2006.01)
*G11C 29/04* (2006.01)

(52) U.S. Cl.
CPC ........... *G11C 29/52* (2013.01); *H03M 13/453* (2013.01); *G11C 2029/0409* (2013.01); *G11C 2029/3602* (2013.01)

(58) Field of Classification Search
USPC .................................. 714/764, 780, 755, 43
See application file for complete search history.

(56) References Cited

U.S. PATENT DOCUMENTS

| | | |
|---|---|---|
| 7,185,259 B2 | 2/2007 | Fujita et al. |
| 8,674,860 B2 | 3/2014 | Wu |
| 2015/0039967 A1* | 2/2015 | Romanovskyy ...... G06F 11/108 714/764 |
| 2015/0186197 A1* | 7/2015 | Ravi ................... G06F 11/076 714/43 |

* cited by examiner

CONDITION OF THE NUMBER OF FLIPS f TO
OBTAIN DECODED WORD OTHER THAN
DECODED WORD #0

$f \geq t-e+1$

MEMORY SYSTEM, MEMORY CONTROLLER AND MEMORY CONTROL METHOD

CROSS-REFERENCE TO RELATED APPLICATIONS

This application is based upon and claims the benefit of priority from U.S. Provisional Application No. 62/214,518, filed on Sep. 4, 2015; the entire contents of which are incorporated herein by reference.

FIELD

Embodiments described herein relate generally to a memory system, a memory controller, and a memory control method.

BACKGROUND

A storage device generally stores data, to which error correction coding has been performed, in order to protect data to be stored. Therefore, when the data stored in the storage device is read, the data to which the error correction coding has been performed is decoded.

DETAILED DESCRIPTION

In general, according to one embodiment, the memory system includes a non-volatile memory, a control unit for reading a received word from the non-volatile memory, and a decoder for performing soft-decision decode to the received word. The decoder includes a test pattern generating unit for generating test patterns which indicate an assumed error position, a hard decision decoder which performs hard-decision decode by using the test patterns and the received word and outputs a decoded word, and a distance calculating unit which calculates a Euclidean distance between the decoded word and the received word based on the decoded words output from hard decision decoder and selects a decoded word which is a decoding result from among the decoded words output from the hard decision decoder based on the Euclidean distance. The number of the decoded words is less than that of the test patterns of all the combinations in a case where the number of flips is of one to a predetermined value.

Exemplary embodiments of a memory system, a memory controller, and a memory control method according to the embodiments will be described in detail below with reference to the drawings. The present invention is not limited to the embodiments.

First Embodiment

Figure 1:
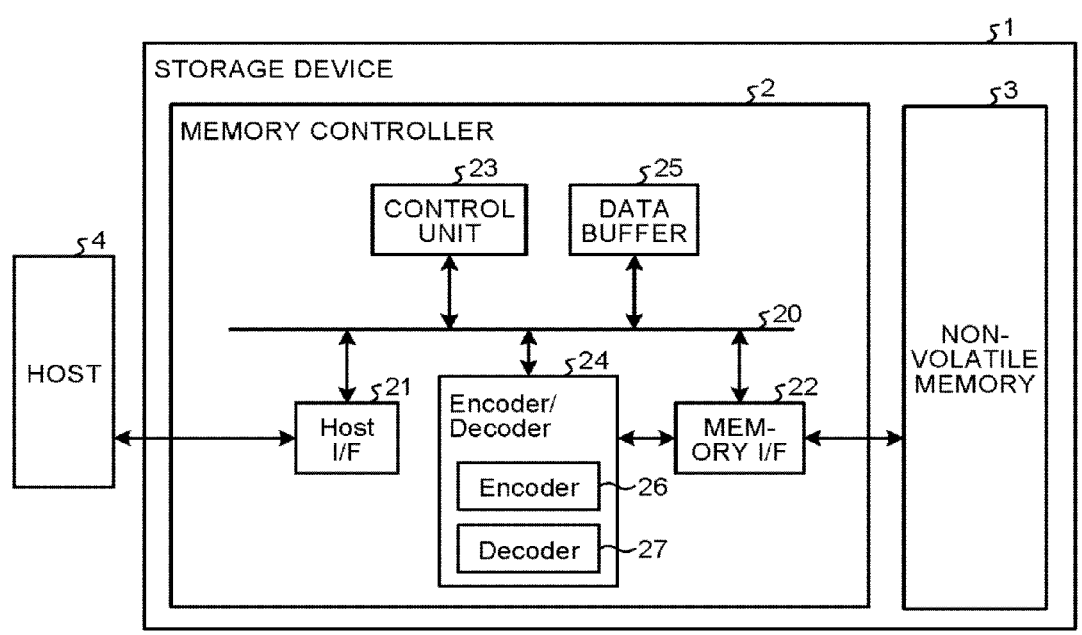
FIG. 1 is a block diagram of an exemplary structure of a memory system according to a first embodiment.

FIG. 1 is a block diagram of an exemplary structure of a storage device according to a first embodiment. A storage device 1 according to the present embodiment includes a memory controller 2 and a non-volatile memory 3. The storage device 1 can be connected to a host 4, and FIG. 1 is a diagram of a state where the storage device 1 is connected to the host 4. The host 4 is an electronic device such as a personal computer and a mobile terminal.

The non-volatile memory 3 is a non-volatile memory which stores data in a non-volatile state. For example, the non-volatile memory 3 is a NAND memory. Here, an example will be described in which the NAND memory is used as the non-volatile memory 3. However, a three-dimensional structure flash memory, a resistance random access memory (ReRAM), a ferroelectric random access memory (FeRAM), and the like which are storage units other than the NAND memory may be used as the non-volatile memory 3. Also, here, an example will be described in which a semiconductor memory is used as the storage unit. However, error correcting processing according to the present embodiment may be applied to a storage device using the storage unit other than the semiconductor memory.

The storage device 1 may be a memory card and the like which includes the memory controller 2 and the non-volatile memory 3 as a single package and may be a solid state drive (SSD) and the like.

The memory controller 2 controls a writing to the non-volatile memory 3 according to a writing command (demand) from the host 4. Also, the memory controller 2 controls a reading from the non-volatile memory 3 according to a reading command from the host 4. The memory controller 2 includes a host interface (Host I/F) 21, a memory interface (memory I/F) 22, a control unit 23, an encoder/decoder 24, and a data buffer 25. The Host I/F 21, the memory I/F 22, the control unit 23, the encoder/decoder 24, and the data buffer 25 are connected to each other with an internal bus 20.

The Host I/F 21 performs processing which is compliant with an interface standard with the host 4 and outputs a command received from the host 4, user data, and the like to the internal bus 20. Also, the Host I/F 21 transmits the user data read from the non-volatile memory 3, a response from the control unit 23, and the like to the host 4. In the present embodiment, data written to the non-volatile memory 3 by a writing demand from the host 4 is referred to as the user data.

The memory I/F 22 performs writing processing to the non-volatile memory 3 based on an instruction from the control unit 23. Also, the memory I/F 22 performs reading processing from the non-volatile memory 3 based on the instruction from the control unit 23.

The control unit 23 totally controls components of the storage device 1. When receiving the command from the host 4 via the Host I/F 21, the control unit 23 performs control according to the command. For example, the control unit 23 instructs the memory I/F 22 to write the user data and parity to the non-volatile memory 3 according to the command from the host 4. Also, the control unit 23 instructs the memory I/F 22 to read the user data and the parity from the non-volatile memory 3 according to the command from the host 4.

Also, when receiving the writing demand from the host 4, the control unit 23 determines a storage region (memory region) on the non-volatile memory 3 relative to the user data accumulated in the data buffer 25. That is, the control unit 23 manages a writing destination of the user data. Correspondence between a logical address of the user data received from the host 4 and a physical address indicating the storage region on the non-volatile memory 3 where the user data has been stored is stored as an address conversion table.

Also, when receiving a reading demand from the host 4, the control unit 23 converts the logical address specified by the reading demand to the physical address by using the address conversion table and instructs the memory I/F 22 to perform the reading from the physical address.

In the NAND memory, generally, writing and reading are performed by a data unit called as a page, and erasure is performed by a data unit called as a block. In the present embodiment, a plurality of memory cells connected to a single word line is referred to as a memory cell group. When the memory cell is a single level cell (SLC), a single memory cell group corresponds to a single page. When the memory cell is a multilevel cell (MLC), a single memory cell group corresponding to a plurality of pages. Also, each memory cell is connected to the word line and also is connected to a bit line. Each memory cell can be identified according to an address to identify the word line and an address to identify the bit line.

The data buffer 25 temporarily stores the user data received by the memory controller 2 from the host 4 until the data is stored in the non-volatile memory 3. Also, the data buffer 25 temporarily stores the user data read from the non-volatile memory 3 until the data is transmitted to the host 4. The data buffer 25 is configured of a general memory such as a static random access memory (SRAM) and a dynamic random access memory (DRAM).

The user data transmitted from the host 4 is forwarded to the internal bus 20 and is stored in the data buffer 25. The encoder/decoder 24 generates a codeword by encoding the data stored in the non-volatile memory 3 and decodes the received word read from the non-volatile memory 3. The encoder/decoder 24 includes an encoder 26 and a decoder 27. The description will be made below while assuming that the data encoded by the encoder/decoder 24 is the user data. The data encoded by the encoder/decoder 24 may include control data used in the memory controller 2 other than the user data.

Next, the writing processing according to the present embodiment will be described. The control unit 23 instructs the encoder 26 to encode the user data at the time of the writing to the non-volatile memory 3. Also, the control unit 23 determines a storage place (storage address) of the codeword in the non-volatile memory 3 and instructs it to the memory I/F 22.

Figure 2:
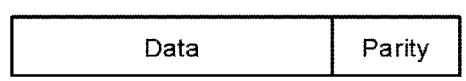
FIG. 2 is a diagram of an exemplary structure of a codeword generated by an encoder.

The encoder 26 generates the codeword by encoding the user data on the data buffer 25 based on the instruction from the control unit 23. For example, Bose-Chandhuri-Hocquenghem (BCH) encoding can be used as an encoding system. FIG. 2 is a diagram of an exemplary structure of the codeword generated by the encoder 26. An example in which the BCH encoding is used is illustrated in FIG. 2, and the codeword includes data (user data) and the parity. The memory I/F 22 performs control to store the codeword to the storage place on the non-volatile memory 3 instructed by the control unit 23.

Next, processing at the time of the reading from the non-volatile memory 3 according to the present embodiment will be described. The control unit 23 specifies the address in the non-volatile memory 3 and instructs the memory I/F 22 to perform the reading at the time of the reading from the non-volatile memory 3. Also, the control unit 23 instructs the decoder 27 to start to decode. The memory I/F 22 reads the received word from the non-volatile memory 3 according to the instruction from the control unit 23. The decoder 27 decodes the received word read from the non-volatile memory 3.

Figure 3:
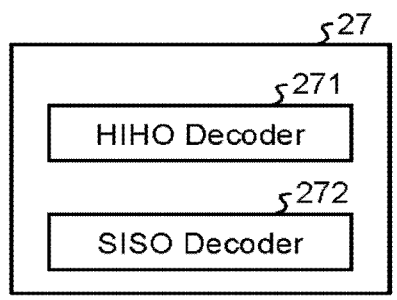
FIG. 3 is a diagram of an exemplary structure of a decoder.

The decoder 27 decodes the received word read from the non-volatile memory 3. FIG. 3 is a diagram of an exemplary structure of the decoder 27. The decoder 27 includes a HIHO Decoder 271 for performing hard-input hard-output (HIHO) decode and a SISO Decoder 272 (decoder) for performing soft-input soft-output (SISO) decode. Generally, the SISO decode has a higher error correcting capability and longer processing time than those of the HIHO decode. In the present embodiment, first, the HIHO Decoder 271 performs the HIHO decode to the received word read from the non-volatile memory 3 as a hard decision value. Then, the HIHO Decoder 271 reads the received word which cannot be decoded by the HIHO decode as a soft decision value. The SISO Decoder 272 performs the SISO decode to the received word which has been read as the soft decision value.

Figure 4:
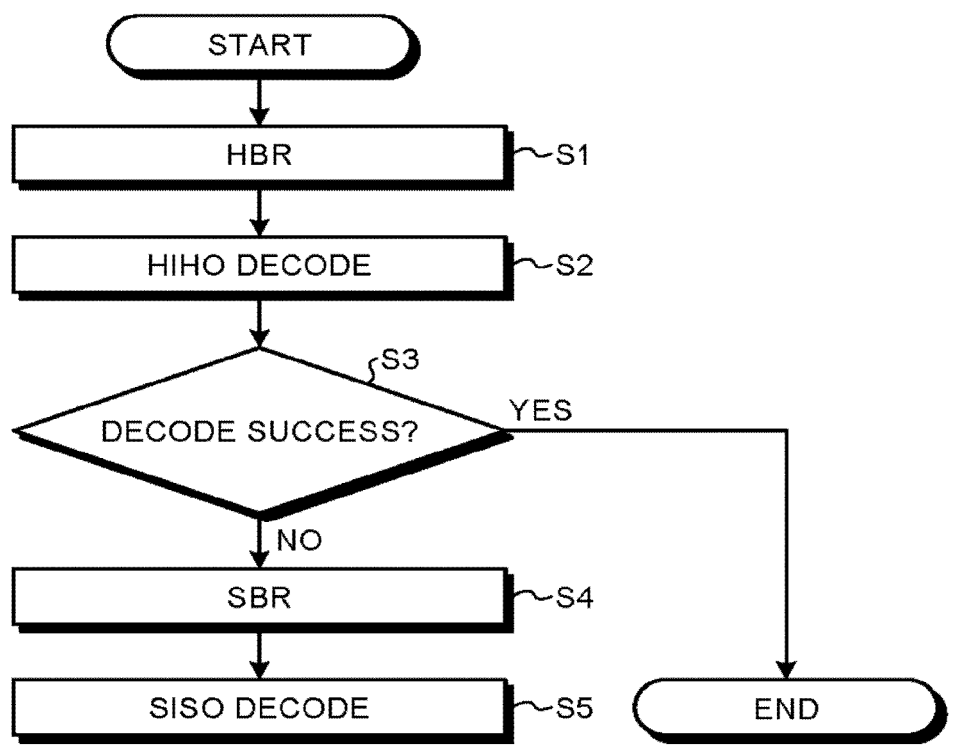
FIG. 4 is a diagram of an exemplary reading processing procedure of the first embodiment.

FIG. 4 is a diagram of an exemplary read processing procedure according to the present embodiment. The control unit 23 specifies the address to be read and instructs the memory I/F 22 to read it from the non-volatile memory 3 by a hard bit read (HBR), and the memory I/F 22 performs the hard bit read (step S1). The hard bit read is a reading method for reading each bit included in the codeword as a hard decision value of 0 or 1. The read received word (hard decision value) is stored in the data buffer 25. Here, an example is described in which the read received word (hard decision value) is stored in the data buffer 25. However, a buffer to store the received word (hard decision value) may be provided in the decoder 27 and may store the received word (hard decision value).

When the non-volatile memory 3 is the NAND memory, electrons are injected at the time of writing the data according to a data value so that the number of electrons (charge amount) of a floating gate corresponds to any one of a plurality of distributions (threshold distribution). Here, to simplify the description, an example of one bit/cell will be described in which a single memory cell stores one bit. In a case of one bit/cell, one of the two distributions corresponds to "zero", and the other corresponds to "one". When a voltage is applied to the memory cell, a current flows in a case where a voltage equal to or higher than a voltage value according to the charge amount of the memory cell is applied. A current does not flow in a case where a voltage lower than the voltage is applied. Therefore, the voltage to be a boundary is determined for each memory cell according to the charge amount of the memory cell. Here, the voltage which is determined according to the charge amount of the memory cell is referred to as a threshold voltage (Vth). An electric charge is injected in an initial state so as to correspond to either one of the two threshold distributions, and a reference read voltage which divides the two threshold distributions is applied to the memory cell at the time of reading. Accordingly, it can be determined whether the data stored in the memory cell is one or not.

The hard bit read is a reading in which the non-volatile memory 3 applies the reference read voltage to the memory cell and determines whether the data stored in the memory cell is one or zero, and then, outputs the determined result. A read voltage to be applied at the time of the hard bit read may be changed from the reference read voltage.

The description returns to FIG. 4. The control unit 23 instructs the decoder 27 to perform the HIHO decode, and the decoder 27 performs the HIHO decode relative to the received word (hard decision value) stored in the data buffer 25 (step S2). Specifically, the HIHO Decoder 271 performs the HIHO decode relative to the received word (hard decision value) read from the data buffer 25.

In the HIHO decode, decode such as bounded distance decode is performed relative to the received word input as the hard decision value. The HIHO decode performed by the HIHO Decoder 271 is not limited to the bounded distance decode, and any HIHO decode may be used.

After step S2, the HIHO Decoder 271 determines whether the decode to the received word has been successfully performed and notifies the control unit 23 of the determination result. The control unit 23 determines whether the decode of the received word has succeeded based on the notification from the HIHO Decoder 271 (step S3). When the decode to the received word has been successfully performed (step S3 Yes), the reading processing is terminated.

When the decode to the received word has been failed (step S3 No), the control unit 23 specifies the address corresponding to the received word and instructs the memory I/F 22 to perform the reading from the non-volatile memory 3 by the soft bit read (SBR). The memory I/F 22 performs the soft bit read (step S4). The soft bit read is a reading for reading the data stored in the non-volatile memory 3 as a soft decision value.

In the present embodiment, the received word read by the soft bit read is also referred to as a communication path value (channel information). In the present embodiment, the communication path value is defined as a logarithmic of a ratio between a conditional probability P (a|x=0) in which a range a includes a value of a threshold voltage under the condition in which a write bit x to each memory cell of the non-volatile memory 3 has logic of zero and a conditional probability P (a|x=1) in which the range a includes the value of the threshold voltage under the condition in which the write bit x to each memory has logic of one. When this is expressed by a formula, the communication path value satisfies ln (P (a|x=0)/P (a|x=1)). Here, ln indicates a natural logarithm. The communication path value is also referred to as a logarithmic likelihood ratio (log likelihood ratio (LLR)).

Figure 5:
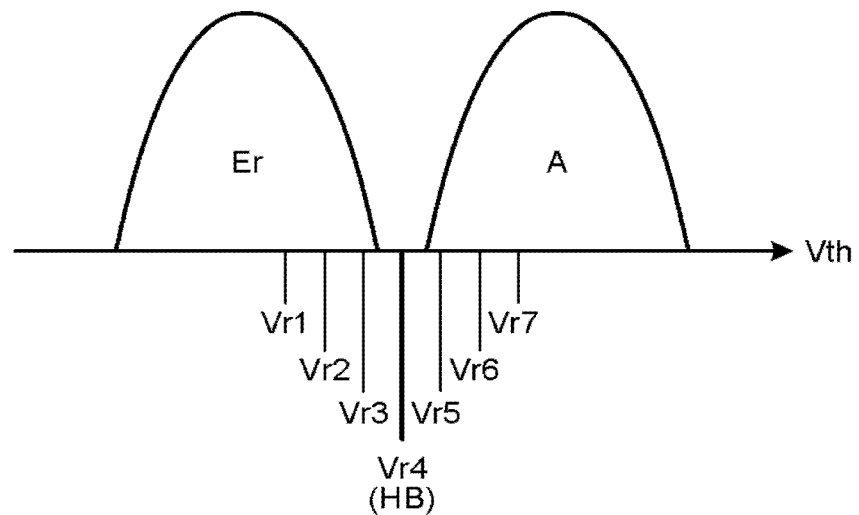
FIG. 5 is a diagram to describe soft bit read.

FIG. 5 is a diagram to describe the soft bit read. The horizontal axis in FIG. 5 indicates a threshold voltage, and the vertical axis indicates a frequency. In FIG. 5, and an example of the single level cell for storing one bit/cell is illustrated. An erase (Er) distribution on the left side corresponds to data value of one, and an A distribution on the right side corresponds to data value of zero. In the soft bit read, reading at plurality of read voltages, which are on both sides of the reference read voltage, in addition to the reference read voltage used in the hard bit read is performed. In the example in FIG. 5, the soft bit read is performed at seven read voltages in total. The read voltage described as Vr4 (HB) indicates the reference read voltage used in the hard bit read. In the soft bit read, the reading is performed by using seven read voltages in total. The seven read voltages includes Vr4, and Vr1, Vr2, and Vr3 which are lower than Vr4, and Vr5, Vr6, and Vr7 which are higher than Vr4. The number of the read voltages in the soft bit read is not limited to seven.

Figure 6:
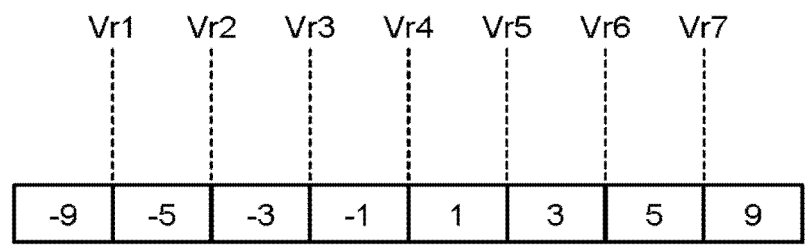
FIG. 6 is a diagram of an exemplary LLR table.

For example, the LLR can be obtained by using the LLR table from the determination result whether the threshold voltage for each memory cell is equal to or more than each read voltage. FIG. 6 is a diagram of an exemplary LLR table. For example, when it has been determined that the threshold voltage of the memory cell is less than Vr1, the LLR is −9. When it has been determined that the threshold voltage of the memory cell is equal to or more than Vr1 and less than Vr2, the LLR is −5. FIG. 6 is an example, and the LLR table is not limited to the example in FIG. 6. Also, the LLR may be obtained by using a calculation formula without using the LLR table. In the present embodiment, an operation for performing the soft bit read and conversion into the LLR is referred to as "to read the data from the non-volatile memory 3 as a soft decision value".

The memory controller 2 and the non-volatile memory 3 may convert the determination result whether the threshold voltage of each memory cell is equal to or more than each read voltage into the LLR. When the memory controller 2 performs the conversion, for example, the non-volatile memory 3 outputs information indicating which region the threshold voltage of each memory cell is in from among eight regions, i.e., a region lower than Vr1, a region equal to or higher than Vr1 and lower than Vr2, a region equal to or higher than Vr2 and lower than Vr3, a region equal to or higher than Vr3 and lower than Vr4, a region equal to or higher than Vr4 or lower than Vr5, a region equal to or higher than Vr5 and lower than Vr6, a region equal to or higher than Vr6 and lower than Vr7, and a region equal to or higher than Vr7. The memory I/F 22 obtains the LLR based on the LLR table and the information output from the non-volatile memory 3 and outputs it to the decoder 27.

The example of the single level cell for storing one bit/cell has been described in FIGS. 5 and 6. However, in a case of the multilevel cell, similarly to the example of the single level cell, the reading is performed at the plurality of read voltages for each boundary of the threshold distributions. The LLR is calculated based on the result of the reading at the plurality of read voltages.

The description returns to FIG. 4. The control unit 23 instructs the decoder 27 to perform the SISO decode, and the decoder 27 performs the SISO decode (step S5).

By performing the above-mentioned processing, when the error can be corrected by performing the hard bit read and the HIHO decode, the decode is terminated by performing the hard bit read and the HIHO decode. Accordingly, the reading can be performed at a high speed. On the other hand, when the error cannot be corrected by performing the hard bit read and the HIHO decode, the error correcting capability can be improved by performing the SISO decode with a high correcting capability. In the present embodiment, the hard bit read and the HIHO decode have been performed first, and the soft bit read and the SISO decode have been performed when the error cannot be corrected by performing the hard bit read and the HIHO decode. However, the soft bit read and the SISO decode may be performed at the beginning without performing the hard bit read and the HIHO decode.

Figure 7:
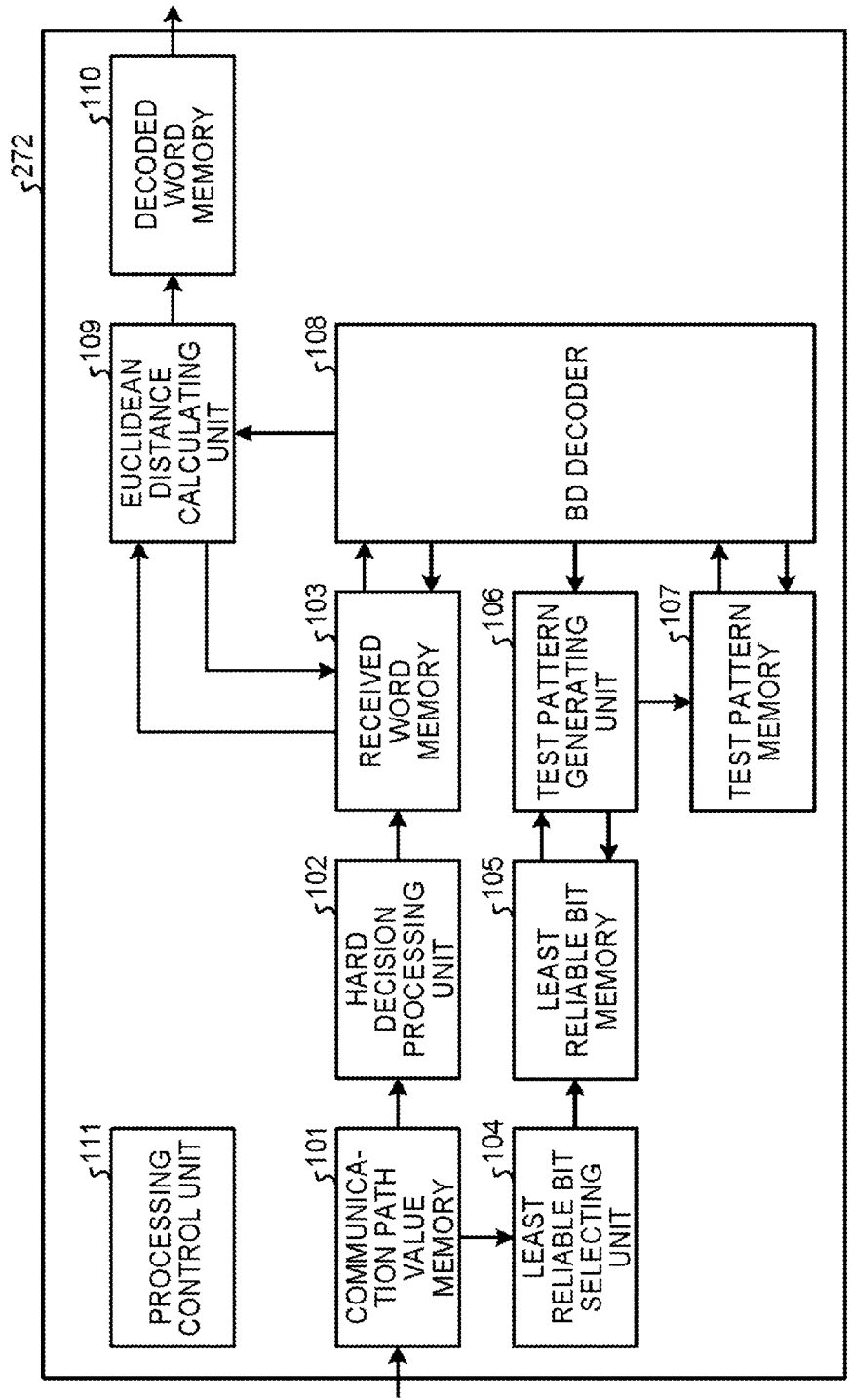
FIG. 7 is a diagram of an exemplary structure of a SISO Decoder.

Next, the SISO decode according to the present embodiment will be described. FIG. 7 is a diagram of an exemplary structure of the SISO Decoder 272. As illustrated in FIG. 7, the SISO Decoder 272 includes a communication path value memory 101, a hard decision processing unit 102, a received word memory 103, a least reliable bit selecting unit 104, a least reliable bit memory 105, a test pattern generating processing unit 106, a test pattern memory 107, a bounded distance (BD) decoder 108 (hard decision decoder), a Euclidean distance calculating unit 109 (distance calculating unit), a decoded word memory 110, and a processing control unit 111. The processing control unit 111 controls operations of each unit in the SISO Decoder 272.

The SISO Decoder 272 performs the soft-decision decode using the test pattern, such as Chase decode. Each of the test pattern indicates a bit position which is assumed to be wrong and is information indicating a bit position where a bit value is inverted, that is, an error is corrected. The SISO Decoder 272 generates one or more test patterns and performs the hard-decision decode to the received word to which the test patterns is added, in other words, result of inverting the bit value at the bit position indicated by the test pattern in the received word. In the present embodiment, an example in which the BD decode is used as the hard-decision decode is described. However, a method of the hard-decision decode is not limited to this. The SISO Decoder 272 selects the decoded word which is a final decoding result based on the Euclidean distance between the plurality of decoded words obtained by the BD decode and the received words. In the following description, to assume to be wrong in the test pattern is referred to as "to flip". The number of bits which is assumed to be wrong in the test pattern, that is, the number of bits in which the bit value is inverted is referred to as "the number of flips". The test pattern may be information of an address indicating the bit position to be flipped and may be information in which the information indicating whether to flip each bit of the least reliable bit to be described is stored for each bit.

The communication path value memory 101 is a memory for storing the communication path value read from the non-volatile memory 3, that is, the received word read by the soft bit read as the soft decision value. The hard decision processing unit 102 performs the hard decision to the received word based on the communication path value read from the communication path value memory 101. The received word memory 103 is a memory for storing the received word to which the hard decision processing is performed by the hard decision processing unit 102. The least reliable bit selecting unit 104 selects the least reliable bit which is a bit having least reliability based on the communication path value read from the communication path value memory 101. For example, the least reliable bits (least reliable bit: LRB) are a fixed number of bits selected in an ascending order of the reliability. The fixed number is an integer of two or more. The description will be made as assuming that the number of bits of the least reliable bits per received word is fixed. However, it is not necessary that the number of bits of the least reliable bits is fixed. The least reliable bit memory 105 stores an address of the least reliable bit selected by the least reliable bit selecting unit 104. For example, when the address of the LRB is stored in the least reliable bit memory 105, the address of each bit is stored in an ascending order of the reliability for each received word.

The test pattern generating unit 106 generates the test pattern based on the address of the least reliable bit read from the least reliable bit memory 105 and the number of flips notified by the processing control unit 111. The test pattern memory 107 stores the test patterns generated by the test pattern generating unit 106. The BD decoder 108 performs the bounded distance decode (referred to as BD decode below) relative to the received word read from the received word memory 103 and the received word to which the test pattern has been added.

The Euclidean distance calculating unit 109 calculates the Euclidean distance between the received word read from the received word memory 103 and the decoded word obtained by the BD decode performed by the BD decoder 108. Also, when the calculated Euclidean distance is smaller than the Euclidean distance corresponding to the decoded word stored in the decoded word memory 110, the Euclidean distance calculating unit 109 updates the decoded word stored in the decoded word memory 110 and the Euclidean distance to the latest decoded word and Euclidean distance. The Euclidean distance calculating unit 109 may calculate the Euclidean distance between the communication path value and the decoded word obtained by the BD decode performed by the BD decoder 108 instead of calculating the Euclidean distance between the received word read from the received word memory 103 and the decoded word obtained by the BD decode performed by the BD decoder 108.

The decoded word memory 110 stores the decoded word which has the shortest Euclidean distance with the received word and the Euclidean distance corresponding to the decoded word. As described above, when the calculated latest Euclidean distance is shorter than the Euclidean distance stored in the decoded word memory 110, the Euclidean distance calculating unit 109 updates the value of the decoded word memory 110. Accordingly, the decoded word memory 110 stores the decoded word which has the shortest Euclidean distance with the received word and the Euclidean distance corresponding to the decoded word. That is, the Euclidean distance calculating unit 109 selects the decoded word which has the shortest Euclidean distance with the received word. Here, the decoded word which has the shortest Euclidean distance with the received word has been selected. However, for example, a method for selecting the decoded word by combining the Euclidean distance with the received word and the other condition may be used. That is, the present embodiment is not limited to the example in which the decoded word having the shortest Euclidean distance with the received word is selected. The present embodiment can be applied to a case where the decoded word is selected based on the Euclidean distance with the received word.

Figure 8:
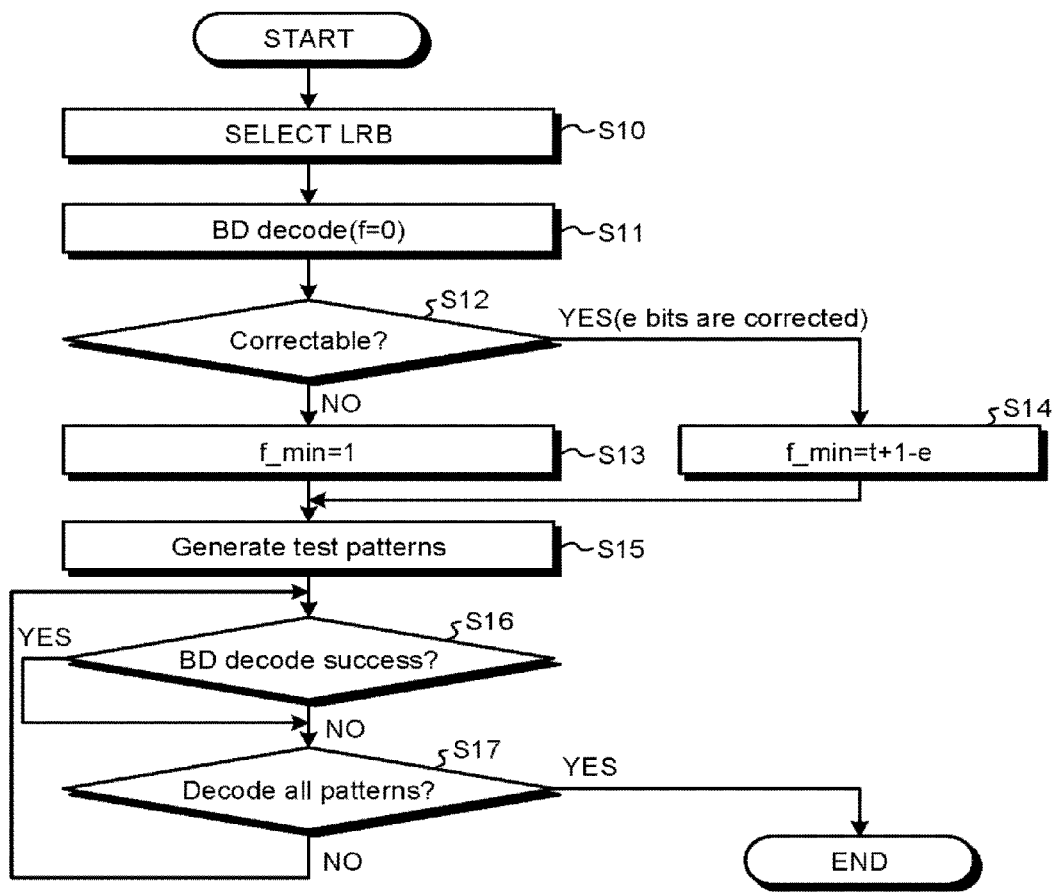
FIG. 8 is a flowchart of an exemplary SISO decode processing procedure by the SISO Decoder according to the first embodiment.

Next, an operation of the SISO Decoder 272 will be described. FIG. 8 is a flowchart of an exemplary SISO decode processing procedure by the SISO Decoder 272 according to the present embodiment. First, the least reliable bit selecting unit 104 of the SISO Decoder 272 selects the least reliable bit (LRB) (step S10). Specifically, the processing control unit 111 instructs the communication path value memory 101 to output the communication path value to the least reliable bit selecting unit 104 and the hard decision processing unit 102, and the least reliable bit selecting unit 104 selects the LRB from among the bits included in the received word based on the input communication path value.

For example, as described above, a fixed number of bits in an ascending order of the reliability are selected as the LRB. The communication path value is the received word read from the non-volatile memory 3 by the soft bit read and is stored in the communication path value memory 101 directly or via the data buffer 25. The communication path value is information indicating the LLR, that is, the reliability of each bit. Therefore, the communication path value memory 101 selects the LRB based on an absolute value of the LLR of each bit. The least reliable bit selecting unit 104 stores an address of the bit of the selected LRB, that is, information indicating a bit position of the LRB in the received word to the least reliable bit memory 105. Also, the hard decision processing unit 102 stores the received word, which has been obtained by performing the hard decision to the input communication path value, to the received word memory 103.

Next, the SISO Decoder 272 initializes the number of flips f to zero and performs the BD decode (step S11). As described above, the number of flips indicates the number of bits to be flipped in the test pattern. Therefore, a condition in which the number of flips is zero means that the BD decode is performed to the received word without practically adding the test pattern. Therefore, specifically, the processing control unit 111 instructs the BD decoder 108 to decode the received word read from the received word memory 103 in step S11. The BD decoder 108 reads the received word from the received word memory 103 and performs the BD decode relative to the read received word according to the instruction by the processing control unit 111. The BD decoder 108 notifies the processing control unit 111 of whether the correction by the BD decode has been successfully performed. Also, when the correction by the BD decode has been successfully performed, the BD decoder 108 notifies the processing control unit 111 of the number of error bits e corrected by the BD decode.

Next, the processing control unit 111 determines whether the correction by the BD decode in a case where the number of flips is zero has been successfully performed (step S12). When the correction has not succeeded (step S12 No), the processing control unit 111 sets the minimum value f_min of the number of flips in the test pattern to be one (step S13).

Next, the SISO Decoder 272 generates the test pattern (step S15). Specifically, the test patterns of the number of flips f_min to f_max are generated. The value of f_max is a predetermined value which is the maximum value of f, and any integer values equal to or less than the LRB can be set as f_max. It is assumed that f_max have been previously set in the test pattern generating unit 106. Also, f_max may be previously set in the processing control unit 111 and be instructed from the processing control unit 111 to the test pattern generating unit 106. In step S15, specifically, the processing control unit 111 specifies f_min which is the minimum number of flips and instructs to generate the test pattern relative to the test pattern generating unit 106. The test pattern generating unit 106 reads the address of the LRB from the least reliable bit memory 105 and generates the test pattern, in which the bits of the number of flips from among the LRBs are flipped, based on the address of the LRB. When it is assumed that the number of bits of the LRB be m (m is an integer of one or more), the number of test patterns generated relative to the number of flips f is the number of combinations $_mC_f$ in which f bits are selected from among m bits. For example, when the number of flips is one, one bit is flipped. Therefore, the test patterns of the number of bits of the LRB are generated. A total number of the test patterns of the number of flips f_min to f_max is a sum of $_mC_f$ from f=f_min to f=f_max.

Next, the SISO Decoder 272 performs the BD decode by using one of the test patterns and determines whether the BD decode has been successfully performed (step S16).

Specifically, the processing control unit 111 selects the test pattern to be used for the BD decode from among the test patterns stored in the test pattern memory 107. Then, the processing control unit 111 specifies the selected test pattern and instructs the BD decoder 108 to perform the BD decode to it. The BD decoder 108 reads one of the test patterns stored in the test pattern memory 107 based on the instruction from the processing control unit 111. The BD decoder 108 then generates a bit string, in which the bit value at the bit position indicated by the test pattern from among the received words is inverted, by using the read test pattern and the received word read from the received word memory 103 and performs the BD decode relative to the generated bit string. The BD decoder 108 notifies the processing control unit 111 of whether the BD decode has been successfully performed. Also, the BD decoder 108 outputs the decoded word obtained by the BD decode to the Euclidean distance calculating unit 109. As described above, the Euclidean distance calculating unit 109 calculates the Euclidean distance between the received word read from the received word memory 103 and the decoded word obtained by the BD decode. When the calculated Euclidean distance is smaller than that corresponding to the decoded word stored in the decoded word memory 110, the Euclidean distance calculating unit 109 updates the decoded word stored in the decoded word memory 110 and the Euclidean distance respectively to the latest decoded word and Euclidean distance. The processing control unit 111 determines whether the BD decode has been successfully performed based on the notification from the BD decoder 108.

When the BD decode has been successfully performed (step S16 Yes), the processing control unit 111 determines whether the BD decode corresponding to all the test patterns stored in the test pattern memory 107 has been performed (step S17). When the BD decode corresponding to all the test patterns has been performed (step S17 Yes), the procedure ends.

When the BD decode has not been successfully performed (step S16 No), since the decoded word has not obtained by the BD decode, the decoded word is not output to the Euclidean distance calculating unit 109. The procedure proceeds to step S17. Also, when the determination in step S17 is No (step S17 No), the processing control unit 111 changes the test pattern to which the BD decode is performed, and the procedure proceeds to step S16.

Also, when the correction by the BD decode in a case where the number of flips is zero has been successfully performed in step S12 (step S12 Yes), the minimum value f_min of the number of flips in the test pattern is set to be t+1−e (step S14), and the procedure proceeds to step S15. The value t is an integer of one or more and indicates the maximum number of correctable errors per received word, that is, the error correcting capability.

After the procedure has been terminated, the processing control unit 111 outputs the decoded word stored in the decoded word memory 110, that is, the decoded word selected by the Euclidean distance calculating unit 109 based on the Euclidean distance with the received word as the decoding result by the SISO Decoder 272, that is, the decode result of the soft-decision decode.

Figure 9:
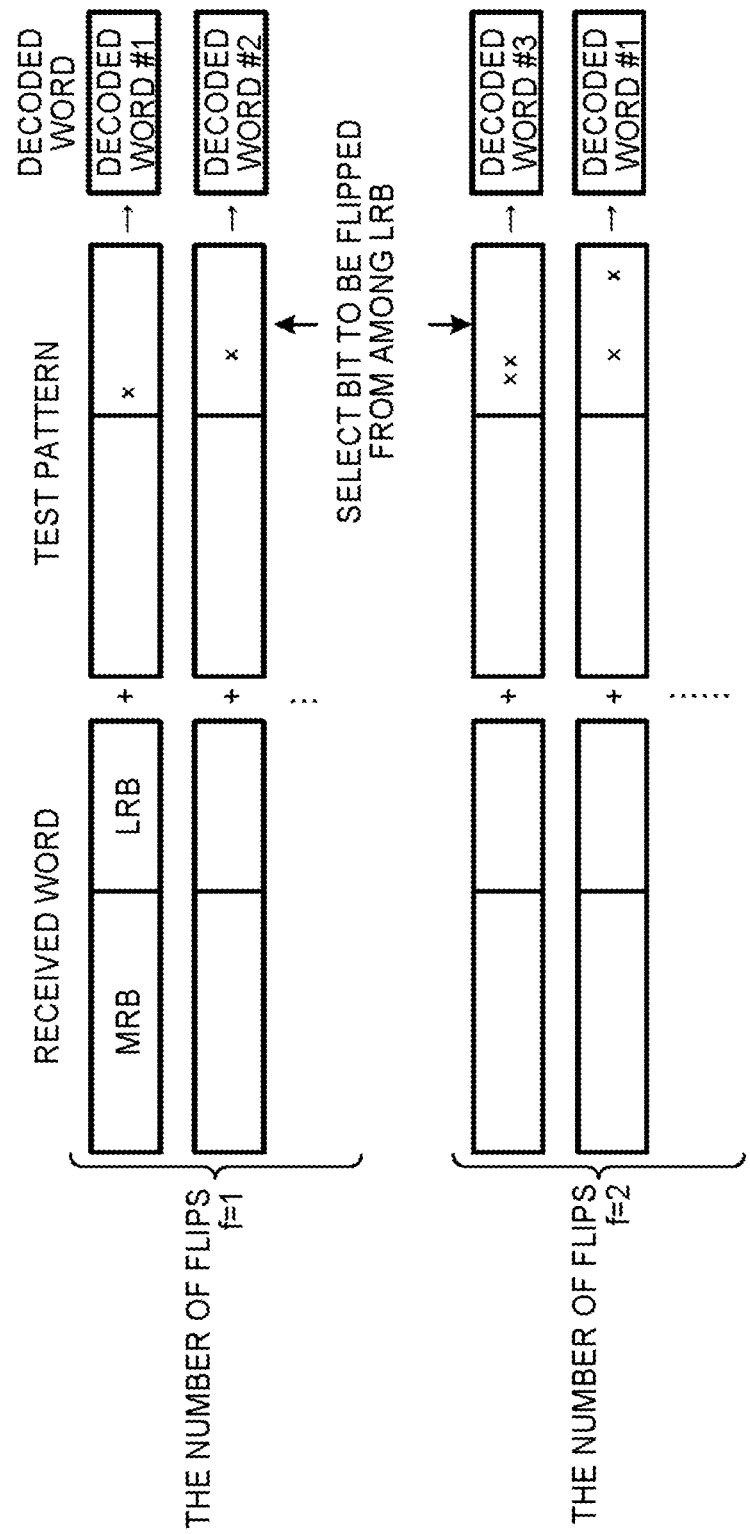
FIG. 9 is a diagram of exemplary decoded words obtained for each test pattern.

Here, an effect obtained by setting the minimum value f_min of the number of flips in the test pattern to be t+1−e will be described. FIG. 9 is a diagram of exemplary decoded words obtained for each test pattern. An example is illustrated in FIG. 9 in which the test pattern where the bit position to be flipped by the number of flips from one to f_max while the minimum value of the number of flips in the test pattern is assumed as one is generated. An example in which the minimum value of the number of flips is one corresponds to a case where the error correction by the BD decode in a case where the number of flips is zero has been failed in step S11.

The most reliable bit (MRB) illustrated in FIG. 9 is a bit other than the LRB in the received word. For easy understanding, the received word is divided into the MRB and the LRB in FIG. 9. However, it is not necessary to rearrange the received word in fact as illustrated in FIG. 9, and it is preferable that the bit position of the LRB in the received word be recognized. In the example in FIG. 9, a decoded word #1 is obtained by performing the BD decode by using a test pattern indicated in the first line in the test patterns of which the number of flips is one. A decoded word #2 is obtained by performing the BD decode by using a test pattern indicated in the second line. On the other hand, a decoded word #3 is obtained performing the BD decode by using a test pattern in the first line in the test patterns of which the number of flips is two. The decoded word #1 is obtained by performing the BD decode by using the test pattern indicated in the second line of the test patterns of which the number of flips is two. In this way, the same decoded words (decoded word #1 in the example in FIG. 9) may be obtained by using different test patterns.

As described above, since the same decoded word has the same Euclidean distance between the received word and the decoded word, the same calculations are redundantly performed. In the present embodiment, in order to avoid redundant calculations, the minimum value of the number of flips at the time of generating the test pattern is determined so as to obtain the decoded word which is different from that obtained by the BD decode in a case where the number of flips is zero. Especially, when the number of flips is large, the number of test patterns becomes large. Therefore, the effect of the present embodiment increases.

Figure 10:
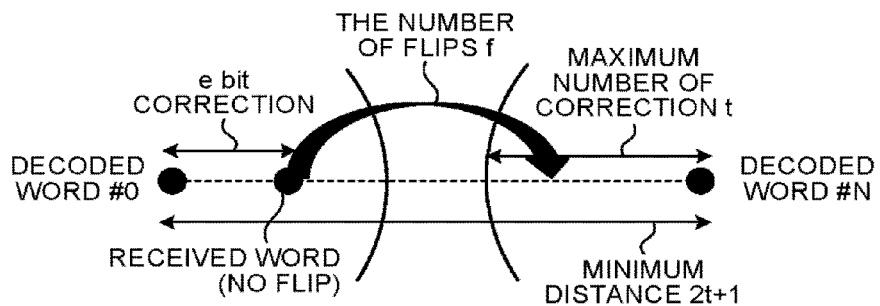
FIG. 10 is a diagram of a condition in which a decoded word different from a decoded word obtained by performing BD decode with no flips is obtained.

FIG. 10 is a diagram of a condition in which a decoded word different from a decoded word obtained by performing BD decode with no flips is obtained. In the example in FIG. 10, the decoded word in a case where the BD decode is performed to the received word is the decoded word #0, and the number of bits corrected by the BD decode is e. A decoded word #N is a decoded word different from the decoded word #0. In order to make the decoded word #N different from the decoded word #0, it is necessary to satisfy the condition in which a range where a distance to the decoded word #N is t is not overlapped with a range where a distance to the decoded word #0 is t. It is necessary that the distance between the decoded word #0 and the decoded word #N is equal to or more than 2t+1. Therefore, when the following formula (1) is satisfied, the decoded word #N is different from the decoded word #0.

$$f \geq t-e+1 \quad (1)$$

In the present embodiment, when the correction by the BD decode in a case where the number of flips is zero has been successfully performed, the number of flips is determined to satisfy the above formula (1) so that the decoded word which is the same as that in a case where the number of flips is zero is not obtained. That is, the minimum value of the number of flips is set to be t−e+1. Accordingly, the redundant calculations can be reduced, and calculation time can be shorter than that in a case where the test pattern is generated without considering the overlap of the decoded words. When the correction by the BD decode in a case where the number of flips is zero has been failed, the minimum value of the number of flips is set to be one as illustrated in step S13.

Figure 11:
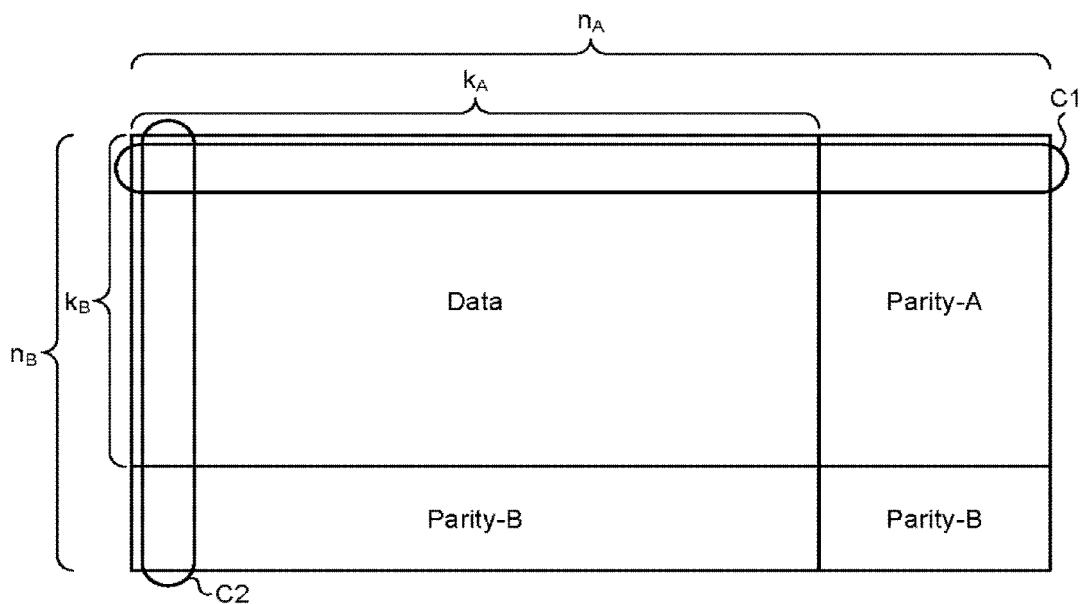
FIG. 11 is a diagram of an exemplary structure of a product code.

In the above description, an example in which the codeword illustrated in FIG. 2 is generated has been described. However, the decode method according to the present embodiment may be applied to the product code. FIG. 11 is a diagram of an exemplary structure of the product code. As illustrated in FIG. 11, $k_B$ codewords C1 with the length $n_A$ including data with the length $k_A$ in the row direction and Parity-A are generated, and a codeword C2 in the column direction with the length no is generated by encoding the data included in the codeword with the length $k_B$ in the row direction. The parity in the column direction is the Parity-B. When the product code configured in this way is decoded, as described above, the decode may be performed as reducing the test patterns corresponding to the overlapped decoded words by using the SISO Decoder 272 according to the present embodiment in a case where the SISO decode is performed to the component codewords C1 and C2 configuring the product code.

As described above, in the present embodiment, when the correction by the BD decode in a case where the number of flips is zero has been successfully performed, the minimum number of flips in the test pattern is determined based on the number of correction by the BD decode in a case where the number of flips is zero. That is, the Euclidean distance with the received word is calculated based on the decoding results of which the number is less than that of the test patterns of all the combinations for each of the number of flips. Therefore, the redundant calculations can be reduced and processing time can be shortened compares with a case where the test patterns of all the combinations of the number of flips are used.

Second Embodiment

Figure 12:
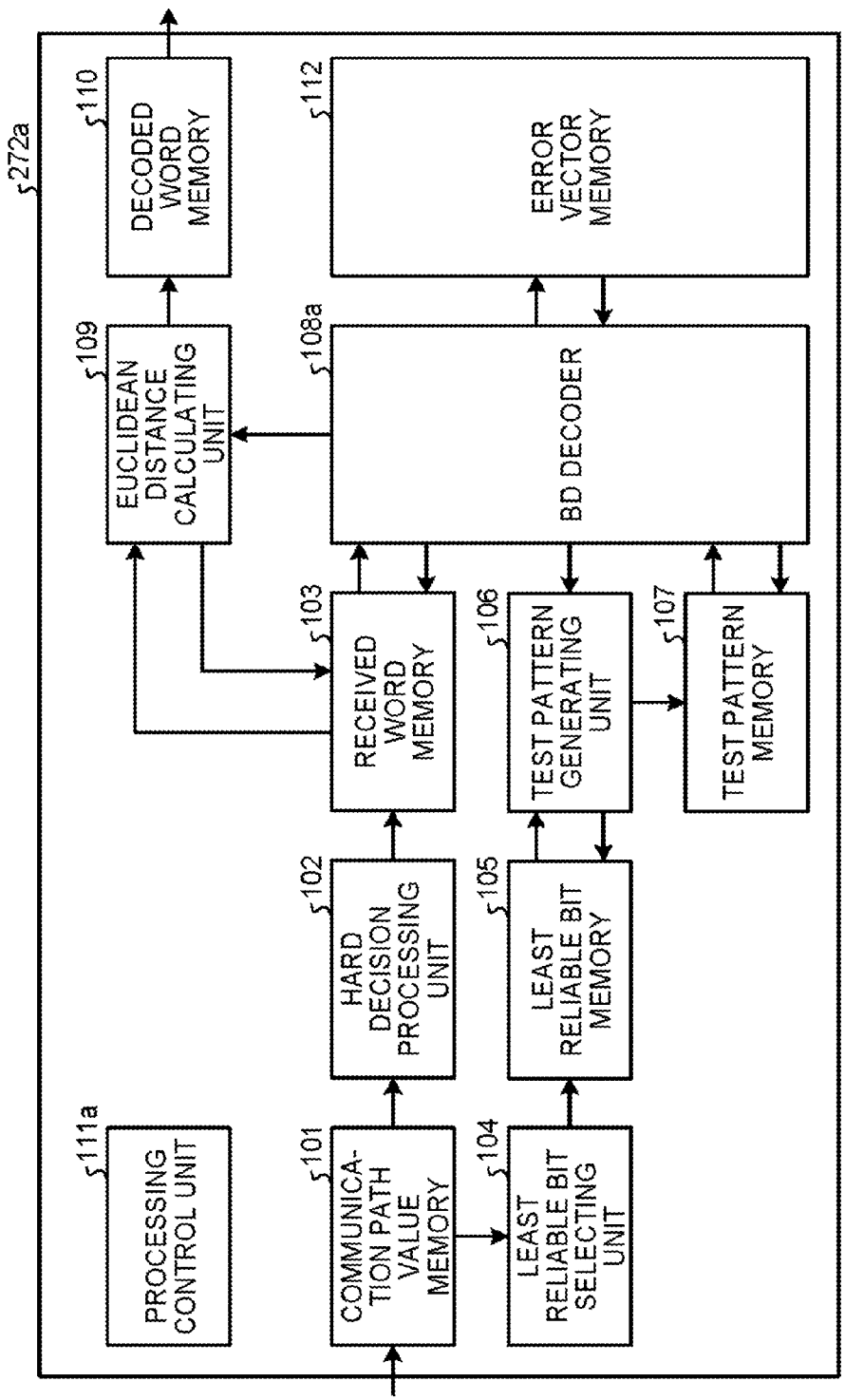
FIG. 12 is a block diagram of an exemplary structure of a SISO Decoder of a storage device according to a second embodiment.

FIG. 12 is a block diagram of an exemplary structure of a SISO Decoder 272a of a storage device according to a second embodiment. The structure of the storage device according to the second embodiment is similar to that of the storage device according to the first embodiment except for that the SISO Decoder 272 is replaced with the SISO Decoder 272a. Components different from those of the first embodiment will be described below.

In the SISO Decoder 272a according to the present embodiment, an error vector memory 112 is added to the SISO Decoder 272 of the first embodiment, and the processing control unit 111 and the BD decoder 108 are respectively replaced with a processing control unit 111a and a BD decoder 108a (hard decision decoder). Other components are similar to those of the SISO Decoder 272 according to the first embodiment. The components having the similar functions to those of the first embodiments are denoted with the same symbols as those in the first embodiment, and overlapped description will be omitted.

The error vector memory 112 stores a bit string (also referred to as a LRB pattern below) corresponding to an address of a least reliable bit from among error vectors obtained by the BD decode performed by the BD decoder 108a. The error vector is information indicating a vector which indicates a position of an error corrected by the BD decode, that is, a position of the error. For example, the error vector is a vector which has a corrected bit position in each bit of the received word is one and a bit value which has not been corrected is zero. The error vector memory 112 stores a bit string (LRB pattern) corresponding to the LRB from among the error vectors obtained by error vector BD decode. The error vector memory 112 may store the error vector instead of storing the bit string corresponding to the LRB to the error vector memory 112.

Figure 13:
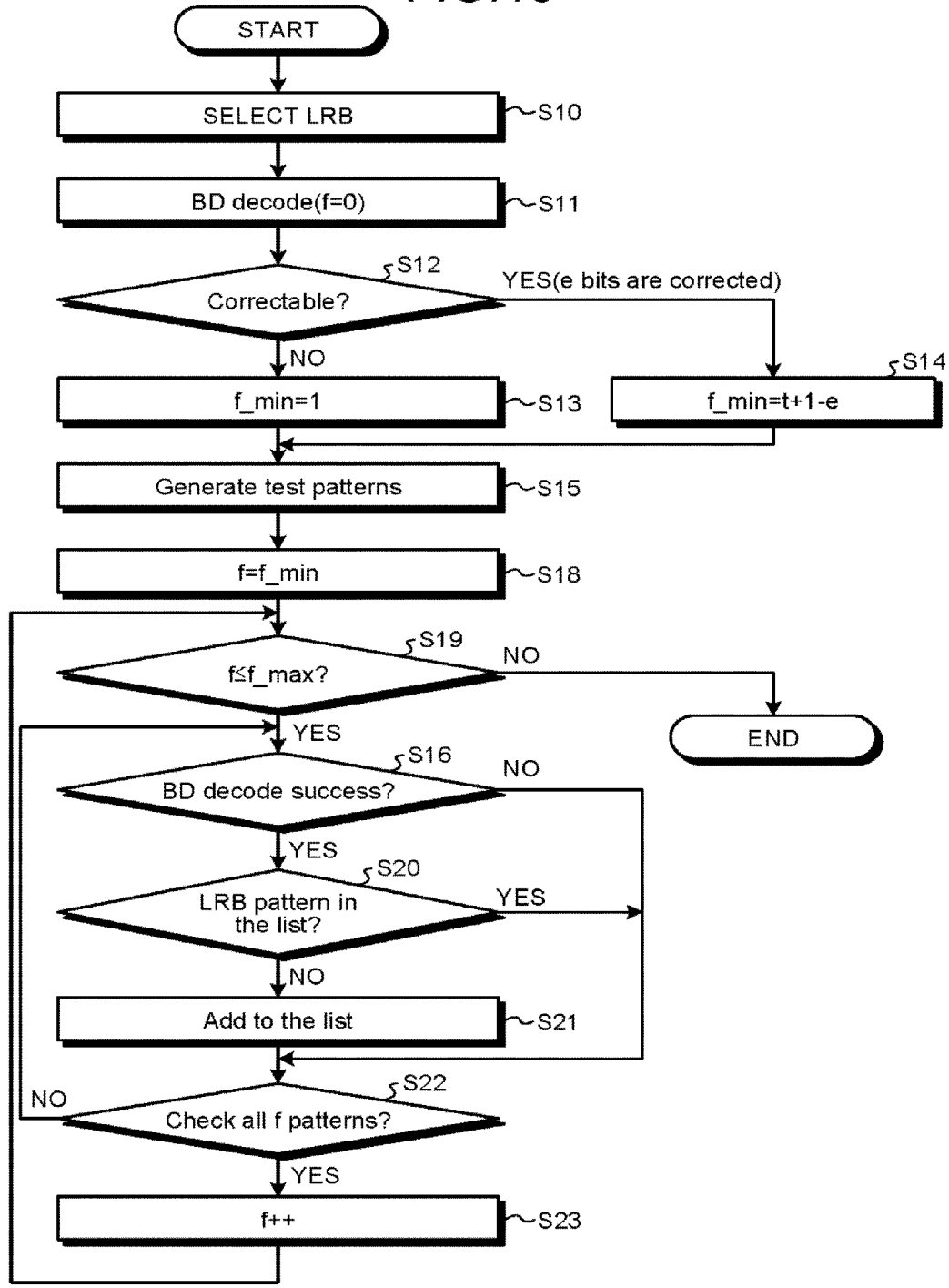
FIG. 13 is a flowchart of an exemplary SISO decode processing procedure by the SISO Decoder according to the second embodiment.

FIG. 13 is a flowchart of an exemplary SISO decode processing procedure by the SISO Decoder 272a according to the present embodiment. Steps S10 to S15 are similar to those of the first embodiment. However, the BD decoder 108a stores the bit string (LRB pattern) corresponding to the LRB from among the error vectors obtained by the BD decode to the error vector memory 112 in step S11.

After step S15, the processing control unit 111a of the SISO Decoder 272a sets f to be f_min (step S18). Next, the processing control unit 111a of the SISO Decoder 272a determines whether f is equal to or less than f_max (step S19). When f is not equal to or less than f_max (step S19 No), the procedure is terminated. When f is equal to or less than f_max (step S19 Yes), the SISO Decoder 272a performs the BD decode by using one of the test patterns of which the number of flips is f and determines whether the BD decode has been successfully performed (step S16a). Step S16 is performed similarly to the first embodiment. However, the test pattern which is used at this time is one of the test patterns of which the number of flips is f. Also, after the BD decode, the BD decoder 108a outputs the LRB pattern to the error vector memory 112 in step S16.

Specifically, in step S16, the processing control unit 111a selects a test pattern used to perform the BD decode from among the test patterns, of which the number of flips is f, stored in the test pattern memory 107. The processing control unit 111a specifies the selected test pattern and instructs the BD decoder 108a to perform the BD decode. The BD decoder 108a reads one of the test patterns stored in the test pattern memory 107 based on the instruction from the processing control unit 111a. The BD decoder 108a then generates a bit string, in which the bit value at the bit position indicated by the test pattern from among the received words is inverted, by using the read test pattern and the received word read from the received word memory 103 and performs the BD decode relative to the generated bit string. The BD decoder 108a notifies the processing control unit 111a of whether the BD decode has been successfully performed. The processing control unit 111a determines whether the BD decode has been successfully performed based on the notification from the BD decoder 108a.

When it has been determined in step S16 that the BD decode has been successfully performed (step S16 Yes), the SISO Decoder 272a determines whether the LRB pattern is in a list (step S20). Here, the list is the LRB pattern stored in the error vector memory 112. Therefore, specifically, the processing control unit 111a determines in step S20 whether any one of the LRB patterns which have already been stored in the error vector memory 112 coincides with the LRB pattern output from the BD decoder 108a to the error vector memory 112.

When the LRB pattern is not included in the list (step S20 No), the processing control unit 111a adds the LRB pattern output from the BD decoder 108a to the list (step S21). That is, the BD decoder 108a stores the LRB pattern output from the BD decoder 108a to the error vector memory 112. Also, when the processing control unit 111a has added the LRB pattern output from the BD decoder 108a to the list, the BD decoder 108a instructs the BD decoder 108a to output the decoded word obtained by the BD decode to the Euclidean distance calculating unit 109. As described above, the Euclidean distance calculating unit 109 calculates the Euclidean distance between the received word read from the received word memory 103 and the decoded word obtained by the BD decode. When the calculated Euclidean distance is smaller than that corresponding to the decoded word stored in the decoded word memory 110, the Euclidean distance calculating unit 109 updates the decoded word stored in the decoded word memory 110 and the Euclidean distance respectively to the latest decoded word and Euclidean distance.

Next, the processing control unit 111a determines whether the BD decode corresponding all the test patterns in a case where the number of flips is f has been performed (step S22). When the BD decode corresponding to all the test patterns in a case where the number of flips is f (step S22 Yes), the processing control unit 111a increases f by one (step S23). The procedure proceeds to step S19.

When it has been determined in step S16 that the BD decode has not been successfully performed (step S16 No), the procedure proceeds to step S22. When it has been determined in step S20 that the LRB pattern is included in the list (step S20 Yes), the procedure proceeds to step S22. Also, it has been determined in step S22 that there is a test pattern which does not perform the BD decode of the test patterns in which the number of flips is f (step 322 No), the test pattern used to perform the BD decode is set to be the test pattern which does not perform the BD decode of the test patterns in a case where the number of flips is f. The procedure proceeds to step S16.

As described above, in the present embodiment, when coinciding with the LRB pattern which has been already generated, the Euclidean distance corresponding to the LRB pattern is not calculated. With this operation, the Euclidean distance with the received word is calculated based on the decoding results of which the number is less than that of the test patterns of all the combinations for each of the number of flips.

In the present embodiment, similarly to the first embodiment, when the correction by the BD decode can be performed in a case where the number of flips is zero, the minimum value of the number of flips in the test pattern is set to be t+1−e. However, the calculation of the Euclidean distance may be avoided in a case where the decoded words are overlapped by performing the processing in the above-mentioned steps S18, S19, S16, and S20 to S23 while assuming that the minimum value of the number of flips is one.

In the above-mentioned example, it has been determined whether the decoded words obtained by the BD decode are overlapped with each other by comparing the LRB patterns. However, the overlap of the decoded words can be determined according to whether the number of bits which are corrected by the BD decode is t, that is, the maximum number of correctable bits.

Figure 14:
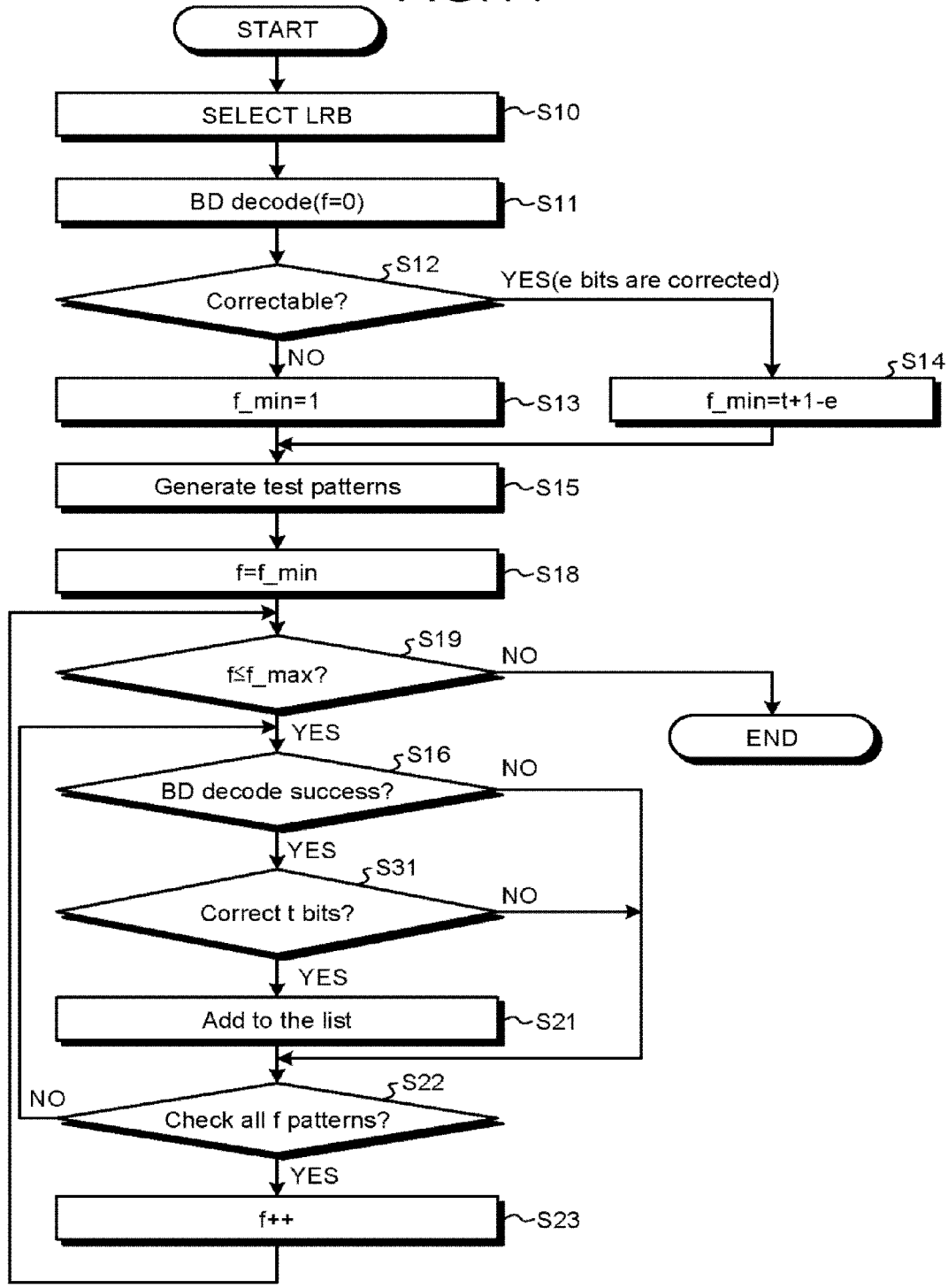
FIG. 14 is a flowchart of an exemplary SISO decode processing procedure by the SISO Decoder when an overlap between decoded words is determined based on the number of bits corrected by BD decode.

FIG. 14 is a flowchart of an exemplary SISO decode processing procedure by the SISO Decoder 272a when the overlap of the decoded words is determined based on the number of bits corrected by the BD decode. A processing procedure in FIG. 14 is similar to that in FIG. 13 except for that step S31 is performed instead of step S20 in FIG. 13. In step S31, the processing control unit 111a obtains the number of bits corrected by the BD decode from the BD decoder 108a and determines whether the number of bits corrected by the BD decode is t (step S31).

When the number of bits corrected by the BD decode is t (step S31 Yes), the procedure proceeds to step S21. When the number of bits corrected by the BD decode is not t (step S31 No), the procedure proceeds to step S22.

In the example in FIG. 14, similarly to the first embodiment, when the correction by the BD decode can be performed in a case where the number of flips is zero, the minimum value of the number of flips in the test pattern is set to be t+1−e. However, the calculation of the Euclidean distance may be avoided in a case where the decoded words are overlapped by performing the processing in the above-mentioned steps S18, S16, S19, S31, S21, S22, and S23 while assuming that the minimum value of the number of flips is one.

Also, by combining the procedures in FIGS. 13 and 14, when the LRB pattern is not in the list and when the number of bits corrected by the BD decode is t in step S20 in FIG. 13, the procedure may proceed to step S21. That is, step S20 or step S31 is an example, and the procedure is not limited to this. It is determined whether the decoded word obtained by the BD decode is overlapped with that which has already been obtained, and it is preferable that the Euclidean distance between the decoded word and the received word be removed from calculation targets when it has been determined that the decoded words have been overlapped.

In the present embodiment, the processing control unit 111a has performed the processing in steps S18, S20 (or S31), S21, S22, and S23. However, the BD decoder 108a may perform at least a part of them.

According to the above processing, when it has been determined that the same decoded words have already been obtained based on the BD decoding result for each test pattern, the decoded word can be removed from the calculation target of the Euclidean distance with the received word. Therefore, the processing time can be shorter than that of the first embodiment.

Third Embodiment

Next, a storage device of a third embodiment will be described. The structure of the storage device according to the present embodiment is similar to that of the second embodiment. Components different from those of the second embodiment will be described below, and the description overlapped with that of the second embodiment will be omitted. In the second embodiment, it has been determined whether the same decoded words have already been obtained based on the BD decoding result for each test pattern. However, in the present embodiment, it is determined whether the test pattern obtains the same decoded word as that which has already been obtained before the BD decode.

Figure 15:
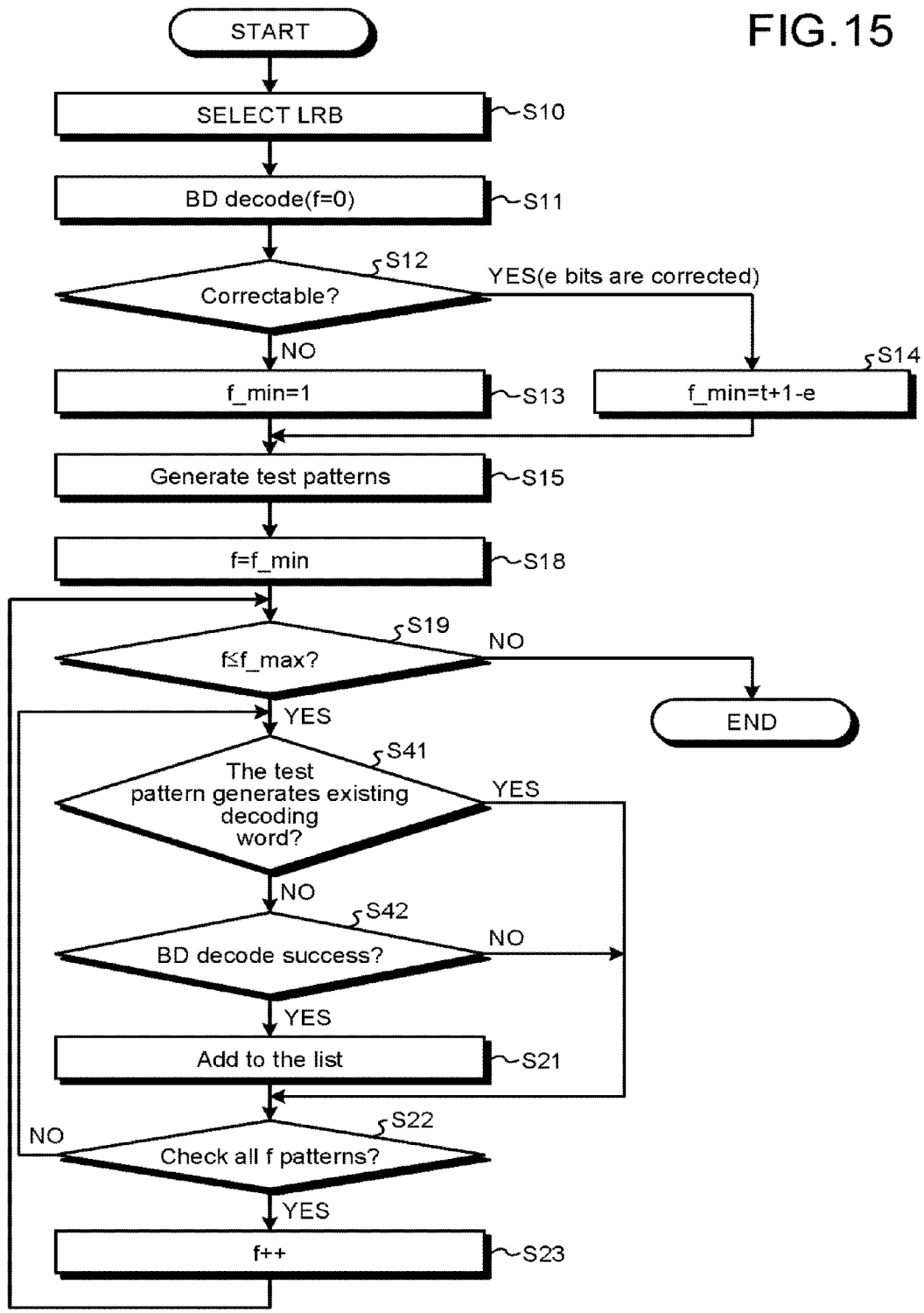
FIG. 15 is a flowchart of an exemplary SISO decode processing procedure by a SISO Decoder according to a third embodiment.

FIG. 15 is a flowchart of an exemplary SISO decode processing procedure by a SISO Decoder 272a according to the present embodiment. Steps S10 to S15, S18, and S19 are similar to those of the second embodiment. However, in step S11, a BD decoder 108a stores a bit string (LRB pattern) in a LRB part and a humming weight $H_M$ in a MRB part in the error vector to an error vector memory 112. The humming weight is the number of bits other than zero in the bit string. After step S19, a processing control unit 111a determines whether the selected test pattern is a test pattern for generating the decoded word which has already been obtained (step S41).

Specifically, the following processing is performed in step S41. The processing control unit 111a obtains a humming distance $H_L$ between the test pattern and the LRB pattern. The processing control unit 111a determines whether a value obtained by adding the humming distance $H_L$ to the humming weight $H_M$ stored in the error vector memory 112, that is, $H_M+H_L$ exceeds the maximum number of correction t. When the value obtained by $H_M+H_L$ exceeds the maximum number of correction t, the processing control unit 111a determines that the test pattern generates the decoded word different from the decoded word which has already been obtained. On the other hand, when the value obtained by $H_M+H_L$ is equal to or less than the maximum number of correction t, the processing control unit 111a determines that the test pattern generates the decoded word overlapped with the decoded word which has already been obtained.

In a case of No in step S41, the processing control unit 111a determines whether the BD decode has been successfully performed (step S42). Specifically, the processing control unit 111a instructs the BD decoder 108a to perform the decode by using the test pattern. The BD decoder 108a performs the BD decode and notifies the processing control unit 111a of whether the BD decode has been successfully performed. Also, the BD decoder 108a outputs the decoded word, which is obtained in a case where the BD decode has been successfully performed, to the Euclidean distance calculating unit 109. The processing control unit 111a determines whether the BD decode has been successfully performed based on the notification from the BD decoder 108a.

When the BD decode has been successfully performed (step S42 Yes), the procedure proceeds to step S21. When the BD decode has not been successfully performed (step S42 No), the procedure proceeds to step S22. Steps S21, S22, and S23 are similar to those of the second embodiment. Also, in a case of Yes in step S41, the procedure proceeds to step S22.

In the present embodiment, similarly to the first embodiment, when the correction by the BD decode can be performed in a case where the number of flips is zero, the minimum value of the number of flips in the test pattern is set to be t+1−e. However, the calculation of the Euclidean distance may be avoided in a case where the decoded words are overlapped by performing the processing in the above-mentioned steps S18, S19, S41, S42, S21, S22 and S23 while assuming that the minimum value of the number of flips is one.

Also, in the present embodiment, by determining whether the obtained decoded words are overlapped with each other before the BD decode is performed, the Euclidean distance to the received word is calculated based on the decoding results (result of the BD decode) of which the number is less than that of the test patterns of all the combinations for each of the number of flips.

As described above, in the present embodiment, it is determined whether the obtained decoded words are overlapped with each other before the BD decode is performed. Therefore, when the obtained decoded words are overlapped with each other, processing of the BD decode can be reduced compared with the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory;
a control unit that reads a received word as a soft decision value from the non-volatile memory; and
a decoder that performs soft-decision decode to the read received word, wherein
the decoder includes
a test pattern generating unit that generates a plurality of test patterns indicating an assumed error position,
a hard decision decoder that performs hard-decision decode by using the plurality of test patterns and the read received word and outputs a plurality of decoded words, each of the plurality of decoded words corresponding to each of the plurality of test patterns,
a distance calculating unit that calculates Euclidean distance between the decoded word and the received word and selects a decoded word to be a decoding result from among the plurality of decoded words output from the hard decision decoder based on the Euclidean distance, the Euclidean distance being calculated based on the plurality of decoded words which are output from the hard decision decoder and of which the number of output decoded words is less than that of all the combinations of the test patterns in a case that the number of flips is one to a predetermined value, the number of flips being the number of errors which are assumed in the test pattern, and
a processing control unit that outputs the selected decoded word.

2. The memory system according to claim 1, wherein
the processing control unit determines the minimum value of the number of flips in the test pattern generated by the test pattern generating unit based on a first value which is the number of errors corrected by performing the hard-decision decode when the hard-decision decode has been successfully performed in a case where the number of flips is zero.

3. The memory system according to claim 2, wherein
the processing control unit determines a value obtained by adding one to a result obtained by subtracting the first value from a second value as the minimum value of the number of flips when the hard-decision decode has been successfully performed in a case where the number of flips is zero, the second value being the maximum number of correctable errors of the received word.

4. The memory system according to claim 1, wherein
the decoder includes
a hard decision processing unit that performs hard decision to a communication path value which is the read received word and generates a received word,
a least reliable bit selecting unit that selects a least reliable bit in the received word based on the communication path value, and
an error vector memory that stores a bit string corresponding to the least reliable bit in error positions obtained by performing the hard-decision decode by the hard decision decoder, and
the hard decision decoder stores the bit string to the error vector memory, outputs the decoded word corresponding to a first bit string to the distance calculating unit when the first bit string which is obtained by the hard-decision decode using the test pattern and the received word generated by the hard decision processing unit does not coincide with a second bit string which is stored in the error vector memory, and does not output the decoded word corresponding to the first bit string to the distance calculating unit when the first bit string coincides with the second bit string.

5. The memory system according to claim 1, wherein
the hard decision decoder outputs the decoded word obtained by the hard-decision decode to the distance calculating unit when the number of errors corrected by the hard-decision decode using the test pattern and the received word coincides with a second value which is the maximum number of correctable errors of the received word and does not output the decoded word obtained by the hard-decision decode to the distance calculating unit when the number of errors corrected by the hard-decision decode by the hard decision decoder is less than the maximum number of correctable errors of the received word.

6. The memory system according to claim 1, wherein
the decoder includes
a hard decision processing unit that performs hard decision to a communication path value which is the read received word and generates a received word,
a least reliable bit selecting unit that selects a least reliable bit in the received word based on the communication path value, and
an error vector memory that stores a bit string corresponding to the least reliable bit in error positions obtained by performing the hard-decision decode by the hard decision decoder and a humming weight of the received word which is obtained by removing the least reliable bit from the error positions,
the hard decision decoder outputs the decoded word obtained by the hard-decision decode to the distance calculating unit when a value obtained by adding a humming distance between a first bit string and a second bit string to the humming weight exceeds a second value, the first bit string being obtained by the hard-decision decode using the test pattern and the received word generated by the hard decision processing unit, the second bit string being stored in the error vector memory, the second value being the maximum number of correctable errors of the received word, and
the hard decision decoder does not output the decoded word obtained by the hard-decision decode to the distance calculating unit when the value obtained by adding the humming distance and the humming weight is equal to or less than the maximum number of correctable errors of the received word.

7. The memory system according to claim 1, wherein
the control unit reads the received word as a hard decision value from the non-volatile memory,
the decoder performs the hard-decision decode to the received word read as the hard decision value,
the control unit reads the received word as a soft decision value from the non-volatile memory when the hard-decision decode is failed, and
the decoder performs the soft-decision decode based on the received word read as the soft decision value.

8. The memory system according to claim 1, wherein
the received word is a codeword which is generated by performing Bose-Chandhuri-Hocquenghem encoding and is stored in the non-volatile memory.

9. A memory controller that controls a non-volatile memory, comprising:
a control unit that reads a received word as a soft decision value from the non-volatile memory; and
a decoder that performs soft-decision decode to the read received word, wherein the decoder includes
a test pattern generating unit that generates a plurality of test patterns indicating an assumed error position,
a hard decision decoder that performs hard-decision decode by using the plurality of test patterns and the read received word and outputs a plurality of decoded words, each of the plurality of decoded words corresponding to each of the plurality of test patterns,
a distance calculating unit that calculates Euclidean distance between the decoded word and the received word and selects a decoded word to be a decoding result from among the plurality of decoded words output from the hard decision decoder based on the Euclidean distance, the Euclidean distance being calculated based on the plurality of decoded words which are output from the hard decision decoder and of which the number of output decoded words is less than that of all the combinations of the test patterns in a case that the number of flips is one to a predetermined value, the number of flips being the number of errors which are assumed in the test pattern, and
a processing control unit that outputs the selected decoded word.

10. A method for controlling a non-volatile memory, the method being performed by a memory controller, the method comprising:
reading a received word as a soft decision value from the non-volatile memory; and
performing soft-decision decode to the read received word, wherein
the soft-decision decode includes
generating a plurality of test patterns indicating an assumed error position,
performing hard-decision decode by using the plurality of test patterns and the read received word and outputting a plurality of decoded words, each of the plurality of decoded words corresponding to each of the plurality of test patterns,
calculating Euclidean distance between the decoded word and the received word based on the plurality of decoded words of which the number of output decoded words is less than that of all the combinations of the test patterns in a case that the number of flips is one to a predetermined value, the number of flips being the number of errors which are assumed in the test pattern,
selecting the decoded word which is a decoding result from among the plurality of decoded words based on the Euclidean distance, and
outputting the selected decoded word.

11. The method according to claim 10, wherein
the hard-decision decode is performed to the received word, and
the minimum value of the number of flips in the test pattern is determined which is generated based on a first value which is the number of errors corrected by the hard-decision decode in a case where the number of flips is zero.

12. The method according to claim 11, comprising:
when the hard-decision decode in a case where the number of flips is zero has been successfully performed, determining a value obtained by adding one to a result obtained by subtracting the first value from a second value as the minimum value of the number of flips, the second value being the maximum number of correctable errors of the received word.

13. The method according to claim 10, comprising:
generating the received word by performing the hard decision to a communication path value which is the read received word;
selecting a least reliable bit in the received word based on the communication path value;
storing a bit string corresponding to the low reliability bit in error positions obtained by the hard-decision decode to an error vector memory;
calculating the Euclidean distance based on a decoded word corresponding to a first bit string when the first bit string obtained by the hard-decision decode using the test pattern and the received word generated by the hard decision does not coincide with a second bit string stored in the error vector memory; and
not calculating the Euclidean distance based on the decoded word corresponding to the first bit string when the first bit string coincides with the second bit string.

14. The method according to claim 10, wherein
when the number of errors corrected by the hard-decision decode using the test pattern and the received word coincides with a second value which is the maximum number of correctable errors of the received word, the Euclidean distance is calculated based on the decoded word obtained by the hard-decision decode, and
when the number of errors corrected by the hard-decision decode is less than the maximum number of correctable errors of the received word, the Euclidean distance is not calculated based on the decoded word obtained by the hard-decision decode.

15. The method according to claim 10, comprising
generating a received word by performing hard decision to a communication path value which is the read received word;
selecting a low reliability bit in the received word based on the communication path value;
storing a bit string corresponding to the low reliability bit in the error positions obtained by the hard-decision decode and a humming weight of the received word which is obtained by removing the low reliability bit to an error vector memory;
calculating the Euclidean distance based on the decoded word obtained by the hard-decision decode when a value obtained by adding a humming distance between a first bit string and a second bit string to the humming weight exceeds a second value, the first bit string being obtained by the hard-decision decode using the test pattern and the received word generated by the hard decision processing unit, the second bit string being stored in the error vector memory, the second value being the maximum number of correctable errors of the received word; and
not calculating the Euclidean distance based on the decoded word obtained by the hard-decision decode when the value obtained by adding the humming distance to the humming weight is equal to or less than the maximum number of correctable errors of the received word.

16. The method according to claim 10, further comprising,
reading a received word as a hard decision value from the non-volatile memory;
performing the hard-decision decode to the received word as a hard decision value, wherein
when the hard-decision decode to the received word as a hard decision value has been failed, the reading the received word as a soft decision value is performed.

17. The method according to claim 10, wherein the received word is a codeword which is generated by performing Bose-Chandhuri-Hocquenghem encoding and is stored in the non-volatile memory.

* * * * *